US012693330B2

(12) United States Patent
Nakane

(10) Patent No.: US 12,693,330 B2
(45) Date of Patent: Jul. 28, 2026

(54) ERRONEOUS WIRING INSPECTION DEVICE

(71) Applicant: SOYO DENSHI CO., LTD., Mie (JP)

(72) Inventor: Shinji Nakane, Aichi (JP)

(73) Assignee: SOYO DENSHI CO., LTD., Mie (JP)

( * ) Notice: Subject to any disclaimer, the term of this patent is extended or adjusted under 35 U.S.C. 154(b) by 0 days.

(21) Appl. No.: 19/172,678

(22) Filed: Apr. 8, 2025

(65) Prior Publication Data

US 2025/0327853 A1  Oct. 23, 2025

(30) Foreign Application Priority Data

Apr. 22, 2024  (JP) ................................. 2024-068829

(51) Int. Cl.
*G01R 31/28* (2006.01)
*G01R 27/14* (2006.01)

(52) U.S. Cl.
CPC ......... *G01R 31/2841* (2013.01); *G01R 27/14* (2013.01)

(58) Field of Classification Search
CPC ..... G01R 31/2841; G01R 27/14; G01R 31/54
See application file for complete search history.

(56) References Cited

U.S. PATENT DOCUMENTS

2015/0346268 A1* 12/2015 Yamashita ......... G01R 31/1272
                                                      324/551
2023/0288457 A1*  9/2023 Vabnick ........... G01R 19/16528

FOREIGN PATENT DOCUMENTS

CN        112262511 A  *  1/2021  .............. H02H 7/26
JP        2005-017263 A     1/2005
WO    WO-2025244136 A1 * 11/2025  ............. G06N 3/088

* cited by examiner

*Primary Examiner* — Sisay Yacob
(74) *Attorney, Agent, or Firm* — Paratus Law Group, PLLC

(57) ABSTRACT

There is provided an erroneous wiring inspection device that can prevent false diagnoses due to current bypass. The erroneous wiring inspection device determines a resistance value and whether or not there is a phase difference based on the measured voltage and the measured current, while an AC generating circuit applies an AC signa. If the resistance value is equal to or greater than a predetermined value, the device stops a first reporting circuit and a second reporting circuit from driving. If the resistance value is less than the predetermined value and there is no phase difference, the device reports the inspection result of the erroneous wiring in the first manner by driving the first reporting circuit without driving the second reporting circuit. If the resistance value is less than the predetermined value and there is the phase difference, the device reports the inspection result of the erroneous wiring in the second manner by driving the second reporting circuit without driving the first reporting circuit. The AC generating circuit periodically alternates a frequency of the AC signal between a first frequency and a second frequency.

2 Claims, 4 Drawing Sheets

ERRONEOUS WIRING INSPECTION DEVICE

CROSS REFERENCE TO PRIOR APPLICATION

This application claims priority to Japanese Patent Application No. 2024-068829 (filed on Apr. 22, 2024), which is hereby incorporated by reference in its entirety.

TECHNICAL FIELD

This specification discloses technology related to erroneous wiring inspection devices.

BACKGROUND ART

An erroneous wiring inspection device is a device used in erroneous wiring inspection to check for erroneous wiring in electrical circuits such as switchboards, distribution boards, and control panels. In the erroneous wiring inspection, false diagnosis due to current bypass is a problem in cases of a component with relatively low DC resistance, such as transformers, motors, and semiconductors, is connected in parallel to the circuit under test. PLT 1 describes an erroneous wiring inspection device equipped with an oscillation circuit that oscillates when the impedance of the circuit under test is below a predetermined value and generates a buzzer sound with the oscillation circuit in order to prevent false diagnoses due to current bypass.

CITATION LIST

Patent Literature

[PLT1]
JP 2005-17263 A

SUMMARY OF INVENTION

Technical Problem

There was room for improvement in the erroneous wiring inspection devices from the viewpoint of preventing false diagnoses due to current bypass. In particular, the erroneous wiring inspection device of PLT 1 reports the presence or absence of conduction, a resistor, a coil, and a capacitor by tone and change of buzzer sound, which requires skill in judging the inspection results.

Solution to Problem

The technology disclosed herein can be realized as the following forms.

One form disclosed herein is an erroneous wiring inspection device. The erroneous wiring inspection device inspects erroneous wiring in an electric circuit. The erroneous wiring inspection device includes: a first probe, a second probe, an AC generating circuit, a voltage measuring circuit, a current measuring circuit, a first reporting circuit, a second reporting circuit, one or more processors; and one or more memories.

The first probe conducts by contact with a first measurement point in the electrical circuit.

The second probe conducts by contact with a second measurement point paired with the first measurement point in the electrical circuit.

The AC generating circuit generates an AC signal to be applied to the first probe. The voltage measuring circuit measures voltage between the first probe and the second probe.

The current measuring circuit measures current flowing through the second probe. The first reporting circuit reports an inspection result of the erroneous wiring in a first manner.

The second reporting circuit that reports the inspection result of the erroneous wiring in a second manner different from the first manner.

The one or more memories have program instructions stored thereon that are executable by the one or more processors to cause the erroneous wiring inspection device to perform the following operations 1-4.

In the operation 1, the erroneous wiring inspection device determines a resistance value between the first measurement point and the second measurement point, and whether or not there is a phase difference between the voltage measured by the voltage measuring circuit and the current measured by the current measuring circuit, based on the measured voltage and the measured current, while the AC generating circuit applies the AC signal to the first probe.

In the operation 2, if the resistance value is equal to or greater than a predetermined value, the erroneous wiring inspection device stops the first reporting circuit and the second reporting circuit from driving.

In the operation 3, if the resistance value is less than the predetermined value and there is no phase difference, the erroneous wiring inspection device reports the inspection result of the erroneous wiring in the first manner by driving the first reporting circuit without driving the second reporting circuit.

In the operation 4, if the resistance value is less than the predetermined value and there is the phase difference, the erroneous wiring inspection device reports the inspection result of the erroneous wiring in the second manner by driving the second reporting circuit without driving the first reporting circuit.

The AC generating circuit periodically alternates a frequency of the AC signal between a first frequency and a second frequency which are mutually different while the AC signal is applied to the first probe.

According to this form of the erroneous wiring inspection device, if there is no phase difference and the resistance value is less than the predetermined value, the inspection result can be reported as "conduction" in the first manner. On the other hand, if there is the phase difference and the resistance value is less than the predetermined value, the inspection result can be reported as "current bypass" in the second manner.

In addition, this form of the erroneous wiring inspection device periodically alternates the frequency of the AC signal between the first frequency and the second frequency which are mutually different. By doing this, the erroneous wiring inspection device can improve the accuracy of detecting current bypass via a coil and a capacitor.

In addition, this form of the erroneous wiring inspection device periodically alternates the frequency of the AC signal between the first frequency and the second frequency which are mutually different. By doing this, the erroneous wiring inspection device can report that the situation is near the boundary where it can detect current bypass via a coil and a capacitor by alternately repeating on and off of the second manner.

In the erroneous wiring inspection device of the above form, the first reporting circuit may be a sound generating unit that outputs sound as the first manner, and the second reporting circuit may be a light emitting unit that outputs visible light as the second manner. According to this form of the erroneous wiring inspection device, if there is no phase difference and the resistance value is less than the predetermined value, the inspection result can be reported as "conduction" in the sound. On the other hand, if there is the phase difference and the resistance value is less than the predetermined value, the inspection result can be reported as "current bypass" in visible light. This allows the user to recognize the inspection result "conduction" by the sound without moving their eyes from the first and second probes. In addition, when the inspection result is "non-conduction" as no sound, the user can check the inspection result is "current bypass" by checking the visible light from the light emitting unit.

The technology disclosed herein can be realized in various forms different from an erroneous wiring inspection device. For example, the technology disclosed herein can be realized in the form of a component of the erroneous wiring inspection device, an erroneous wiring inspection method, and the like.

DESCRIPTION OF EMBODIMENTS

Figure 1:
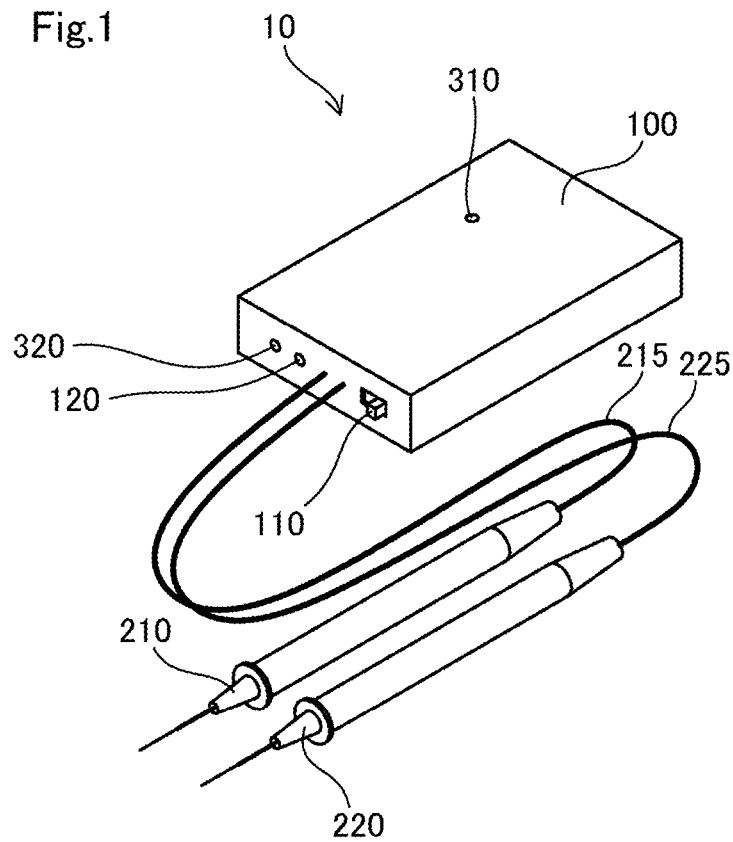
FIG. 1 is an illustration of an external configuration of an erroneous wiring inspection device.

FIG. 1 is an illustration of an external configuration of an erroneous wiring inspection device 10. The erroneous wiring inspection device 10 is a device used in erroneous wiring inspection to check for erroneous wiring in electrical circuits such as switchboards, distribution boards, and control panels. The erroneous wiring inspection device 10 includes a case 100, a power switch 110, an LED unit 120, a buzzer unit 310, an LED unit 320, a probe 210, a cable 215, a probe 220, and a cable 225.

The case 100 of the erroneous wiring inspection device 10 is a box that houses the main components of the erroneous wiring inspection device 10. The case 100 is large enough to be held in one hand by the user.

The power switch 110 of the erroneous wiring inspection device 10 is a switch that accepts instruction input from the user to activate the erroneous wiring inspection device 10. In this embodiment, the power switch 110 is a slide switch.

The LED unit 120 of the erroneous wiring inspection device 10 is a device that outputs a visible light indicating the state of power on and off in the erroneous wiring inspection device 10. The LED unit 120 turns off when the power is off. The LED unit 120 lights green when the power is on. The LED unit 120 turns on red when the voltage of the power supply is low.

The buzzer unit 310 of the erroneous wiring inspection device 10 is a device that outputs an electronic sound. The buzzer unit 310 functions as a first reporting circuit that reports the inspection results of the erroneous wiring in a first manner. The details of the reporting manner by the buzzer unit 310 are described below.

The LED unit 320 of the erroneous wiring inspection device 10 is a device that outputs visible light. In this embodiment, the LED unit 320 outputs orange visible light.

The LED unit 320 functions as a second reporting circuit that reports the inspection results of the erroneous wiring in a second manner different from the first manner. The details of the reporting manner by the LED unit 320 are described below.

The probe 210 of the erroneous wiring inspection device 10 is a first probe that conducts by contact with a first measurement point in an electrical circuit to be tested. The cable 215 of the erroneous wiring inspection device 10 is an electrical wire that physically and electrically connects the probe 210 to the circuitry housed in the case 100.

The probe 220 of the erroneous wiring inspection device 10 is a second probe that conducts by contact with a second measurement point paired with the first measurement point in the electrical circuit to be tested. The cable 225 of the erroneous wiring inspection device 10 is an electrical wire that physically and electrically connects the probe 220 to the circuitry housed in the case 100.

Figure 2:
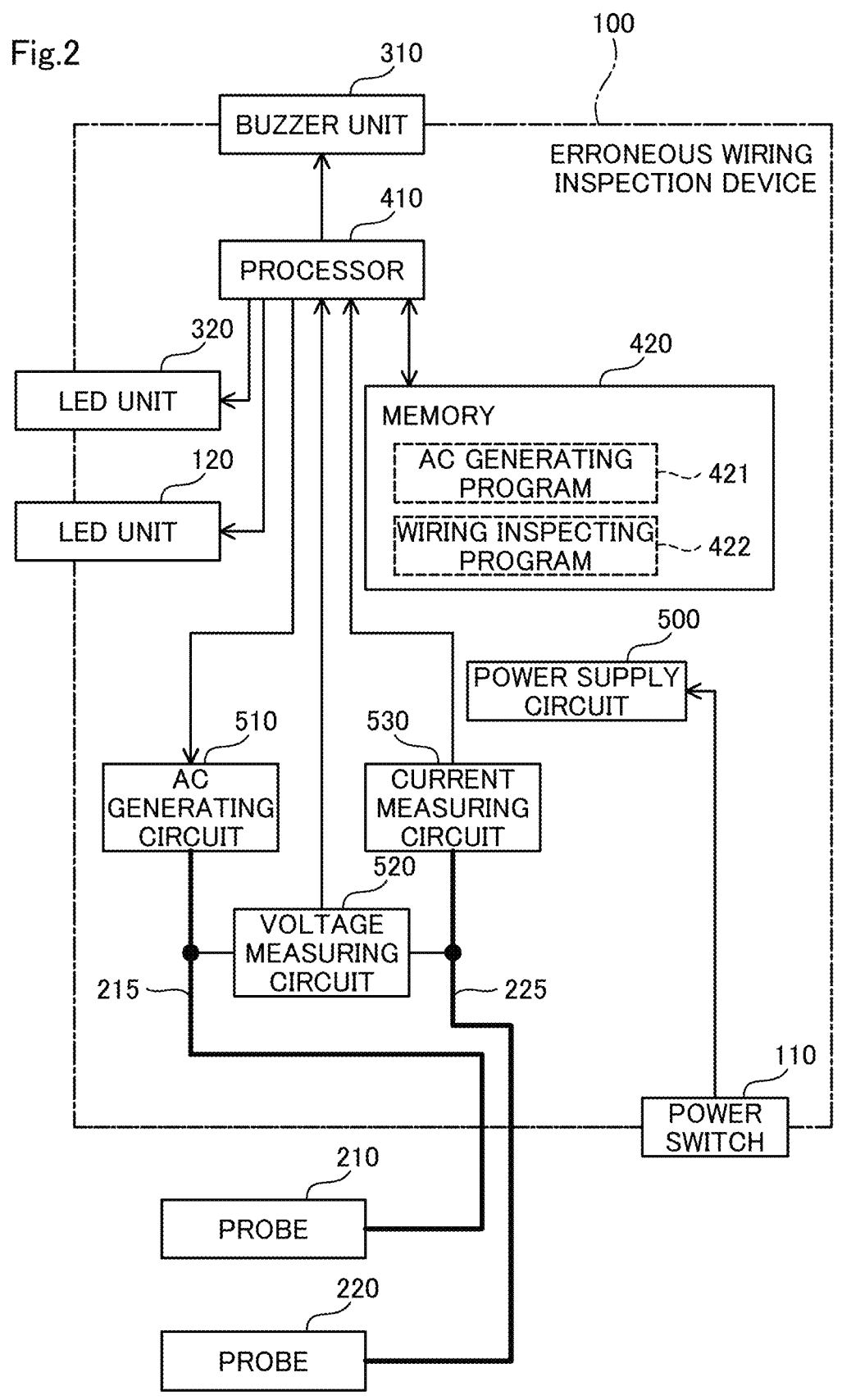
FIG. 2 is an illustration of an internal configuration of the erroneous wiring inspection device.

FIG. 2 is an illustration of an internal configuration of the erroneous wiring inspection device 10. The erroneous wiring inspection device 10 has a processor 410, a memory 420, a power supply circuit 500, an AC generating circuit 510, a voltage measuring circuit 520, and a current measuring circuit 530 as various circuitry housed in a case 100.

The processor 410 of the erroneous wiring inspection device 10 controls each part of the erroneous wiring inspection device 10 by executing a plurality of program instructions stored on the memory 420. The number of processors 410 may be one or more.

The memory 420 of the erroneous wiring inspection device 10 stores the data handled by the processor 410. The number of memories 410 may be one or more. The memory 420 stores an AC generation program 421 and a wiring inspecting program 422, which describe program instructions to be performed by the processor 410. The AC generating program 421 is a computer program for controlling the AC generating circuit 510. The wiring inspecting program 422 is a computer program for implementing the erroneous wiring inspection.

The power supply circuit 500 of the erroneous wiring inspection device 10 is a circuit that supplies power to the various circuits of the erroneous wiring inspection device 10. The power supply circuit 500 supplies power when the power switch 110 is on. The power supply circuit 500 stops supplying power when the power switch 110 is off. In this embodiment, the power supply circuit 500 is a circuit that supplies power from a battery attached to the erroneous wiring inspection device 10. In other embodiments, the power supply circuit 500 may be a circuit that supplies power from an external power source.

The AC generating circuit 510 of the erroneous wiring inspection device 10 is an inverter circuit that generates an AC signal Sa to be applied to the probe 210. Based on a control signal from the processor 410, the AC generating circuit 510 periodically alternates the frequency Fa of the AC signal Sa between the mutually different frequencies Fa1 and Fa2 while applying the AC signal Sa to the probe 210. In this embodiment, the frequency Fa1 is 100 Hz (hertz) and the frequency Fa2 is 1 kHz (kilohertz). In this embodiment, the period SC for switching between frequency Fa1 and frequency Fa2 is 400 ms (milliseconds). The frequency Fa1, frequency Fa2, and the period SC may be set appropriately according to the configuration of the erroneous wiring inspection device 10 and the circuit under test.

The voltage measuring circuit 520 of the erroneous wiring inspection device 10 is a circuit that measures the voltage Vd between the probes 210 and 220. The voltage measuring circuit 520 is electrically connected between the cable 215 connected to the probe 210 and the cable 225 connected to the probe 220. The voltage measuring circuit 520 outputs a signal indicating the value of the voltage Vd to the processor 410.

The current measuring circuit 530 of the erroneous wiring inspection device 10 is a circuit that measures the current Id flowing through the probe 220. The current measuring circuit 530 is electrically connected to the cable 225 connected to the probe 220. The current measuring circuit 530 outputs a signal indicating the value of the current Id to the processor 410.

Figure 3:
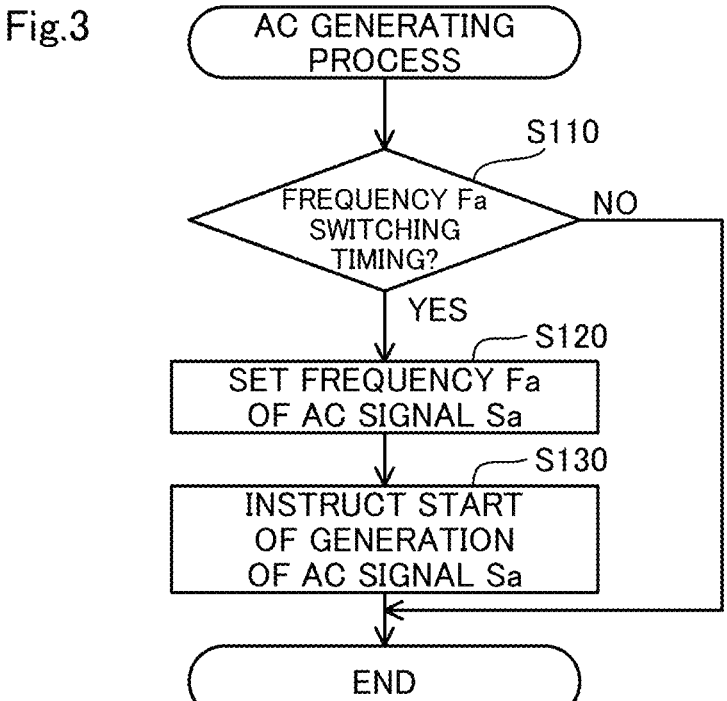
FIG. 3 is a flowchart showing an AC generating process.

FIG. 3 is a flowchart showing an AC generating process. The AC generating process of FIG. 3 is a process for controlling the AC generating circuit 510. The erroneous wiring inspection device 10 repeatedly executes the AC generating process of FIG. 3 at predetermined timing by executing the program instructions included in the AC generating program 421 by the processor 410.

After starting the AC generating process in FIG. 3, the processor 410 determines whether or not it is a switching timing to switch the frequency Fa of the AC signal Sa (step S110). If one period SC (400 ms in this embodiment) for switching the frequency Fa has passed since the previous switching, the processor 410 determines that it is the switching timing of the frequency Fa. If it is not a switching timing of frequency Fa (step S110: "NO"), the processor 410 terminates the AC generating process in FIG. 3.

If it is time to switch the frequency Fa (step S110: "YES"), the processor 410 sets the frequency Fa of the AC signal Sa to a frequency different from the previously set frequency among the frequencies Fa1 and Fa2 (step S120).

After setting the frequency Fa of the AC signal Sa (step S120), the processor 410 instructs the AC generating circuit 510 to start generating the AC signal Sa by the set frequency Fa (step S130). The processor 410 then terminates the AC generating process in FIG. 3.

Figure 4:
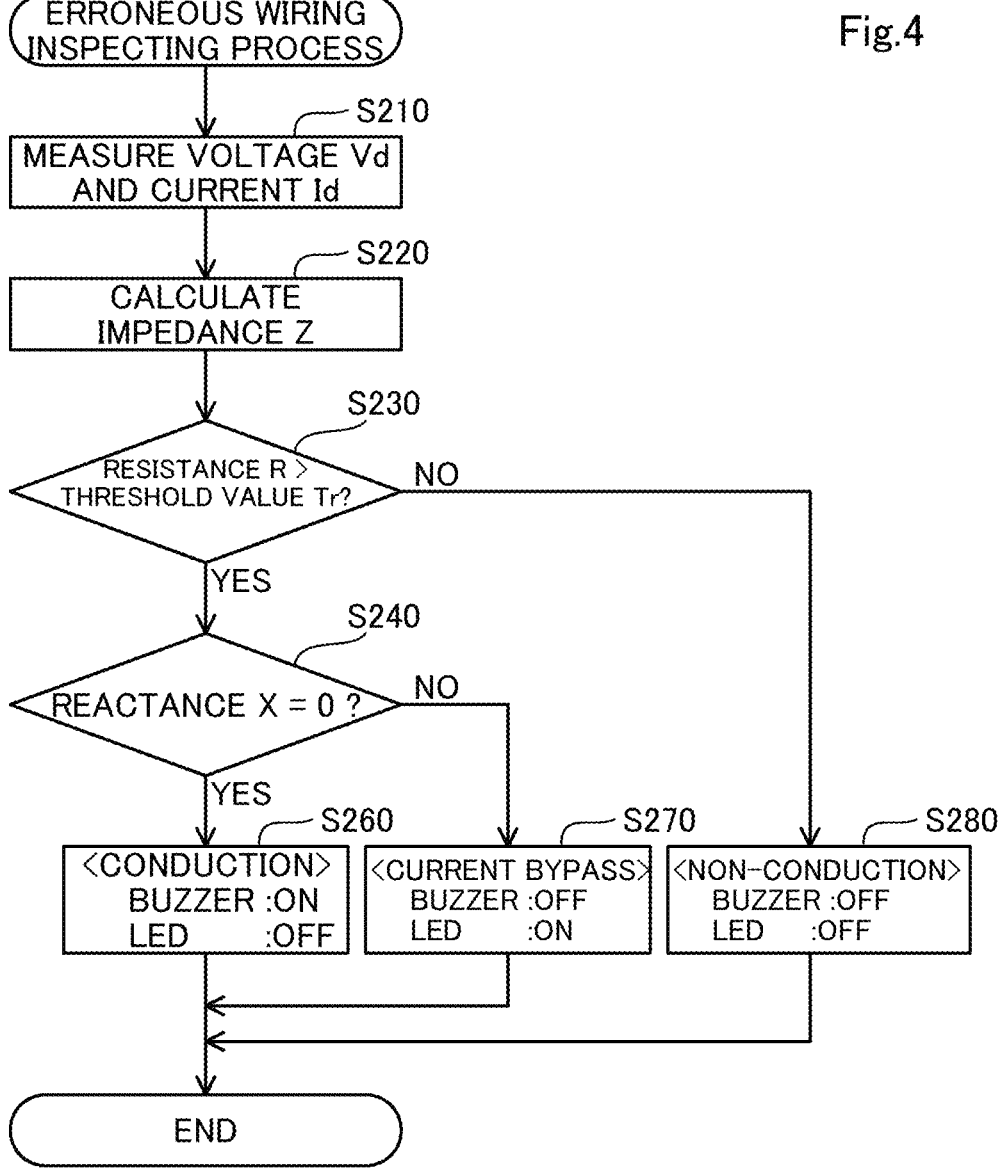
FIG. 4 is a flowchart showing an erroneous wiring inspecting process.

FIG. 4 is a flowchart showing an erroneous wiring inspecting process. The erroneous wiring inspecting process of FIG. 4 is a process for realizing erroneous wiring inspection. The erroneous wiring inspection device 10 repeatedly executes the erroneous wiring inspecting process of FIG. 4 at predetermined timing by executing the program instructions included in the wiring inspecting program 422 by the processor 410.

After starting the erroneous wiring inspecting process in FIG. 4, processor 410 measures voltage Vd and current Id (step S210). The processor 410 measures the voltage Vd based on the output signal from the voltage measuring circuit 520. The processor 410 measures the current Id based on the output signal from the current measuring circuit 530.

After measuring the voltage Vd and current Id (step S210), the processor 410 calculates the impedance Z of the circuit under test based on the measured voltage Vd and current Id (step S220). The impedance Z is expressed by the following equation by means of resistance R, which is the real part (resistance value), and reactance X, which is the imaginary part (where j is an imaginary unit).

$$Z=R+jX$$

After calculating the impedance Z (step S220), processor 410 determines whether the resistance R, the real part (resistance value) of the impedance Z, is less than the threshold value Tr (step S230). In this embodiment, the threshold value Tr is 2Ω (ohms). The value of the threshold value Tr may be set appropriately according to the configuration of the erroneous wiring inspection device 10 and the circuit under test.

If the resistance R exceeds the threshold value Tr (step S230: "NO"), the processor 410 determines that the circuit under test is "non-conduction" and terminates the erroneous wiring inspecting process in FIG. 4 without outputting drive signals to the buzzer unit 310 and LED unit 320 (step S280). As a result, the erroneous wiring inspection device 10 reports "non-conduction" as the inspection result by silencing the buzzer unit 310 and turning off the LED unit 320.

If the resistance R is less than the threshold Tr (step S230: "YES"), the processor 410 determines whether the reactance X, the imaginary part of the impedance Z, is "0" (step S240). In other words, the processor 410 determines whether a phase difference exists between the voltage Vd and the current Id. If an inductor (coil) exists in the circuit under test, the phase of the current Id is delayed with respect to the voltage Vd, so the reactance X is positive. If a capacitor (capacitor) exists in the circuit under test, the phase of the current Id advances with respect to the voltage Vd, so reactance X is negative.

If reactance X is "0" (step S240: "YES"), processor 410 determines that the circuit under test is "conduction" and drives buzzer unit 310 by outputting a drive signal to buzzer unit 310 (step S260). At that time, the processor 410 does not output a drive signal to the LED unit 320, so the LED unit 320 is not activated. After driving the buzzer unit 310 (step S240), the processor 410 terminates the erroneous wiring inspecting process shown in FIG. 4. As a result, the erroneous wiring inspection device 10 reports "conduction" as the inspection result by outputting a continuous sound from the buzzer unit 310 without turning on the LED unit 320.

If reactance X is not "0" (step S240: "NO"), processor 410 determines that the circuit under test has a "current bypass" due to an inductor (coil) or capacitor and outputs a drive signal to the LED unit 320 to drive (step S270). At that time, the processor 410 does not output a drive signal to the buzzer unit 310, so the buzzer unit 310 is not activated. After driving the LED unit 320 (step S270), the processor 410 terminates the erroneous wiring inspecting process in FIG. 4. As a result, the erroneous wiring inspection device 10 reports a "current bypass" as an inspection result by lighting an orange visible light from the LED unit 320 without outputting sound from the buzzer unit 310. When the reactance X is "0" at one of the frequencies Fa1 and Fa2, which are the frequencies Fa of the AC signal Sa that are alternately switched periodically, and when the reactance X is not "0" at the other frequency, the orange visible light output from the LED unit 320 will blink.

According to the erroneous wiring inspection device 10 described above, if there is no phase difference (reactance X) and the resistance value (resistance R) is less than the threshold value Tr, the inspection result can be reported as "conduction" by a continuous sound from buzzer unit 310 as the first manner. On the other hand, if there is the phase difference (reactance X) and the resistance value (resistance R) is less than the threshold value Tr, the inspection result can be reported as "current bypass" by the light continuously emitted from the LED unit 320 as the second manner.

In addition, the erroneous wiring inspection device 10 periodically alternates the frequency Fa of the AC signal Sa between the frequency Fa1 and the frequency Fa2 which are mutually different. By doing this, the erroneous wiring inspection device 10 can improve the accuracy of detecting current bypass via a coil and a capacitor.

In addition, the erroneous wiring inspection device 10 periodically alternates the frequency FA of the AC signal Sa between the frequency Fa1 and the frequency Fa2 which are mutually different. By doing this, the erroneous wiring inspection device 10 can report that the situation is near the boundary where it can detect current bypass via a coil and a capacitor by blinking light of the LED unit 320

According to the erroneous wiring inspection device 10, if there is no phase difference and the resistance value is less than the threshold value Tr, the inspection result can be reported as "conduction" in the sound. On the other hand, if there is the phase difference and the resistance value is less than the threshold value Tr, the inspection result can be reported as "current bypass" in visible light. This allows the user to recognize the inspection result "conduction" by the sound without moving their eyes from the first probe 210 and second probe 220. In addition, when the inspection result is "non-conduction" as no sound, the user can check the inspection result is "current bypass" by checking the visible light from the light emitting unit 320.

The technology disclosed herein is not limited to the above-described embodiments, examples, and variations, but can be realized in various configurations to the extent that the intent is not departed from. For example, among the technical features in the above-described embodiments, examples, and variations, those corresponding to the technical features in each of the forms described in the Summary of the Invention section may be replaced or combined as appropriate to solve some or all of the above-described problems or to achieve some or all of the above-described effects. combination as appropriate to solve some or all of the above-mentioned issues or to achieve some or all of the above-mentioned effects. Also, technical features not described as essential in this specification can be deleted as appropriate.

The erroneous wiring inspection device 10 may switch the frequency Fa, which is set as the AC signal Sa, between three or more frequencies.

The reporting of inspection results is not limited to the above-mentioned embodiments using sound and visible light, but may be reported by various combinations of sound and visible light, or by sound alone, or by visible light alone.

REFERENCE SIGNS LIST

10 . . . Erroneous wiring inspection device
100 . . . Case
110 . . . Power switch
120 . . . LED unit
210 . . . Probe
215 . . . Cable
220 . . . Probe
225 . . . Cable
310 . . . Buzzer unit
320 . . . LED unit
410 . . . Processor
420 . . . Memory
421 . . . AC generating program
422 . . . Wiring inspecting program
500 . . . Power supply circuit

510 . . . AC generating circuit
520 . . . Voltage measuring circuit
530 . . . Current measuring circuit

The invention claimed is:

1. An erroneous wiring inspection apparatus that inspects erroneous wiring in an electric circuit, the erroneous wiring inspection apparatus comprising:

a first probe that conducts by contact with a first measurement point in the electrical circuit;

a second probe that conducts by contact with a second measurement point paired with the first measurement point in the electrical circuit;

an AC generating circuit that generates an AC signal to be applied to the first probe;

a voltage measuring circuit that measures voltage between the first probe and the second probe;

a current measuring circuit that measures current flowing through the second probe;

a first reporting circuit that reports an inspection result of the erroneous wiring in a first manner;

a second reporting circuit that reports the inspection result of the erroneous wiring in a second manner different from the first manner;

one or more processors; and one or more memories having program instructions stored thereon that are executable by the one or more processors to cause the erroneous wiring inspection apparatus to:

determine a resistance value between the first measurement point and the second measurement point, and whether or not there is a phase difference between the voltage measured by the voltage measuring circuit and the current measured by the current measuring circuit, based on the measured voltage and the measured current, while the AC generating circuit applies the AC signal to the first probe;

if the resistance value is equal to or greater than a predetermined value, stop the first reporting circuit and the second reporting circuit from driving;

if the resistance value is less than the predetermined value and there is no phase difference, report the inspection result of the erroneous wiring in the first manner by driving the first reporting circuit without driving the second reporting circuit; and if the resistance value is less than the predetermined value and there is the phase difference, report the inspection result of the erroneous wiring in the second manner by driving the second reporting circuit without driving the first reporting circuit, wherein the AC generating circuit periodically alternates a frequency of the AC signal between a first frequency and a second frequency which are mutually different while the AC signal is applied to the first probe.

2. The erroneous wiring inspection apparatus according to claim 1, wherein, the first reporting circuit is a sound generating unit that outputs sound as the first manner, and the second reporting circuit is a light emitting unit that outputs visible light as the second manner.

* * * * *